United States Patent [19]

Abou et al.

[11] Patent Number: 4,623,852
[45] Date of Patent: Nov. 18, 1986

[54] VOLTAGE CONTROLLED OSCILLATOR HAVING FREQUENCY INDEPENDENT OF PROCESS PARAMETERS

[75] Inventors: Shouji Abou, Kawasaki; Keiko Chikaoka, Tokyo, both of Japan

[73] Assignee: Kabushiki Kaisha Toshiba, Japan

[21] Appl. No.: 789,102

[22] Filed: Oct. 18, 1985

[30] Foreign Application Priority Data

Oct. 31, 1984 [JP] Japan ................................. 59-229229

[51] Int. Cl.$^4$ ............................................. H03B 5/24
[52] U.S. Cl. ..................................... 331/111; 331/34; 331/113 R; 331/177 R
[58] Field of Search ..................... 331/111, 34, 113 R, 331/143, 144, 177 R

[56] References Cited

U.S. PATENT DOCUMENTS

4,110,704  8/1978  Irwin et al. ..................... 331/113 R

FOREIGN PATENT DOCUMENTS

57-73518  5/1982  Japan .................................. 331/111
59-28209  2/1984  Japan .
59-62215  4/1984  Japan ............................. 331/113 R

*Primary Examiner*—Siegfried H. Grimm

*Attorney, Agent, or Firm*—Finnegan, Henderson, Farabow, Garrett & Dunner

[57] ABSTRACT

A voltage controlled oscillator includes an oscillator having at least one first capacitor. The oscillator receives first and second input voltages and charges the first capacitor with a first current corresponding to the first input voltage. The oscillator oscillates at a frequency corresponding to the first and second input voltages. To remove the adverse influence on the oscillating frequency by the change of process parameters caused in the stage of manufacturing the voltage controlled oscillators, a second capacitor is charged for a predetermined period by a current corresponding to the first voltage. After the charging of the second capacitor ends, a sample/hold circuit samples and holds the charged voltage across the second capacitor. An operational amplifier receives, at its positive input terminal, the output voltage of the sample/hold circuit, and, at its negative input terminal, the reference voltage. The operational amplifier controls the first voltage so that the output signal of the sample/hold circuit will be equal to the reference voltage. Repeating the sequence of the charging, sampling and comparing operations eliminates the influence upon the oscillating frequency by the change of the process parameters caused in the manufacturing stage.

10 Claims, 24 Drawing Figures

FIG. 5A  V_A 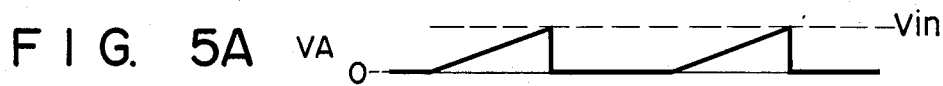
FIG. 5B  V_B 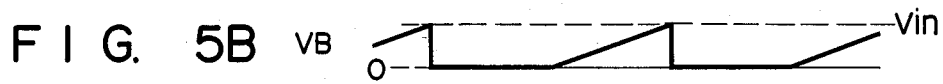
FIG. 5C  Q 
FIG. 5D  $\bar{Q}$ 
FIG. 6A  S1 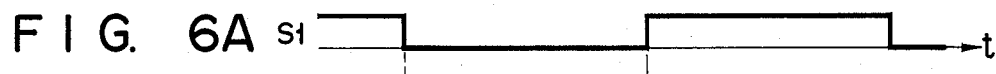
FIG. 6B  S2 
FIG. 6C  Vd 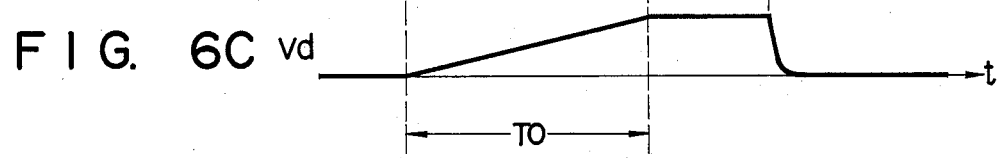
FIG. 8A  CLK 
FIG. 8B  S1 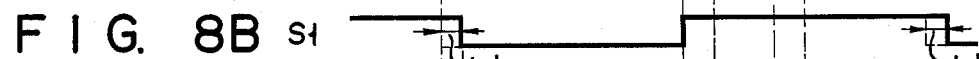
FIG. 8C  S2 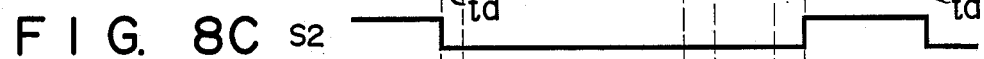
FIG. 8D  S3 
FIG. 8E  S4 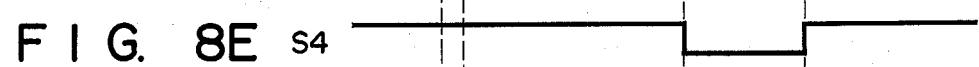
FIG. 8F  Vd 

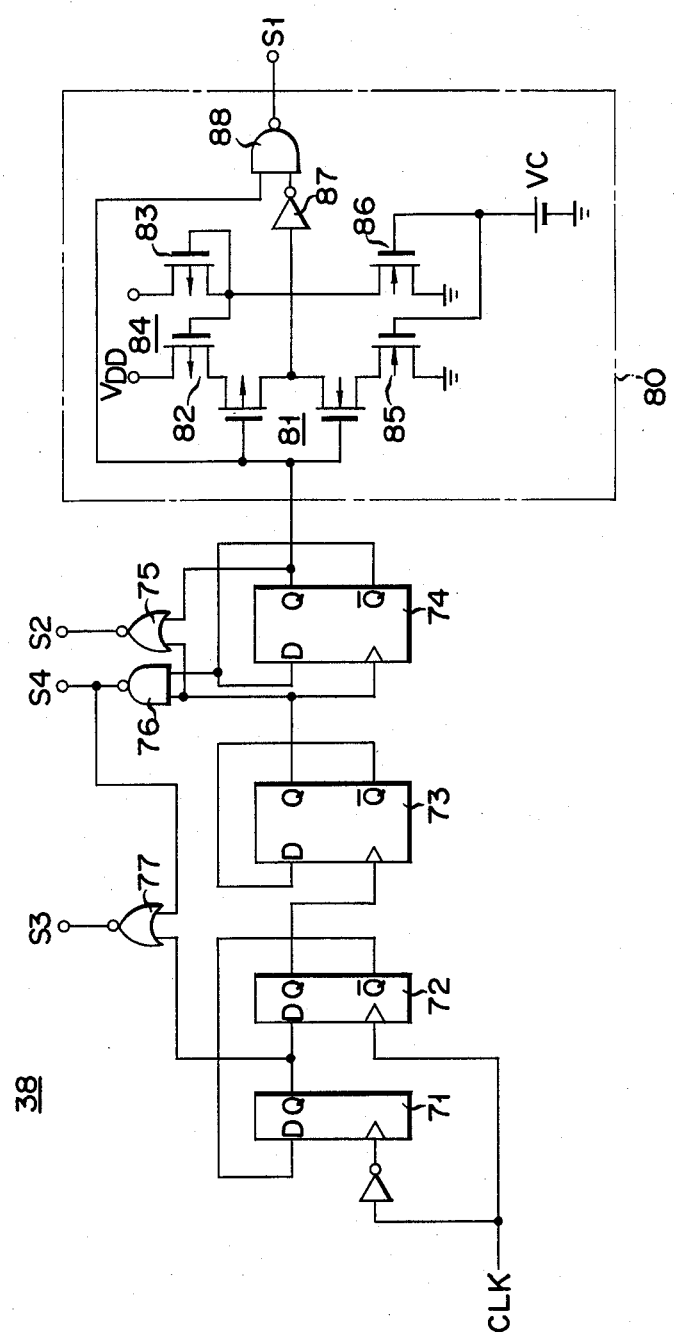
F I G. 9

VOLTAGE CONTROLLED OSCILLATOR HAVING FREQUENCY INDEPENDENT OF PROCESS PARAMETERS

BACKGROUND OF THE INVENTION

The present invention relates to a voltage controlled oscillator (VCO) for producing an output signal of a frequency corresponding to an input voltage applied thereto.

In a PLL (phase locked loop) frequency synthesizer, for example, it is required that the frequency of the output signal always be equal to a preset frequency. To this end, a voltage controlled oscillator (VCO) is usually employed.

A typical example of such a VCO is found in FIG. 1 and 3 in Japanese Patent Disclosure (KOKAI) No. 59-62215.

The output frequency of this prior art tends to vary when process parameters are varied during manufacturing. For example, the thickness of the oxide film can vary and capacitances of the capacitors in the oscillator can change. Variation of the gate lengths of transistors results in variation of the current values for charging the capacitors of the manufactured oscillators. Consequently, the process parameters inevitably vary when the circuit is IC fabricated. This would suggest that the oscillating frequencies of the fabricated oscillators are not invariable for the chips containing them, and that the production yield is reduced.

To solve this problem, Japanese Patent Disclosure (KOKAI) No. 59-28209 discloses an improved voltage controlled oscillator. A block diagram of the VCO shown in FIG. 2b of the KOKAI is shown in FIG. 1 of this specification.

In FIG. 1, first and second oscillators 21 and 22 have equal circuit arrangements and circuit patterns. These oscillators 21 and 22 each oscillate at a frequency corresponding to a: the sum of the voltages applied to voltage input terminals CONT and OFFSET. A reference voltage Vref is applied to the terminal CONT of the oscillator 21. The reference voltage Vref is obtained by dividing the power voltage by a resistive voltage divider, for example. A signal Nref of the reference frequency $f_{ref}$ is input to one of the input terminals of a first phase comparator 23. The output signal of the oscillator 21 is supplied to the other input terminal of the comparator 23. The output signal of the comparator 23 is applied through a first low-pass filter 24 to the input terminal OFFSET of the oscillator 21. These circuits 21, 23, and 24 cooperate to form a PLL.

The output signal of a second phase comparator 25 is applied, as an input voltage Vin, to the voltage input terminal CONT of oscillator 22 through a second low-pass filter 26. The signal output from the filter 24 is applied to the input terminal OFFSET of the oscillator 22. With such a connection, when a voltage equal to the reference voltage Vref is applied to the input terminal CONT of the oscillator 22, the oscillator 22 oscillates at a frequency equal to that of the first oscillator 21.

In this way, the FIG. 1 circuit is controlled, independant of varied process parameters, so as to oscillate at the reference frequency when the input voltage to the second oscillator 22 is equal to the reference voltage. Thus, even if the process parameters vary, the FIG. 1 circuit constantly oscillates at the fixed frequency $f_{ref}$ if the input voltage is set to the reference voltage.

However, if the input voltage Vin shifts to differ in value from the reference voltage Vref, the oscillating frequency is influenced by the change in the process parameters. The oscillating frequency of the FIG. 1 circuit is given by $$f = \alpha(Vin + Voffset) \qquad (1)$$

where $\alpha$ is a proportional coefficient.

In the above equation, when the process parameters are varied, the proportional coefficient changes. The change of the $\alpha$ changes the inclination of a characteristic curve of the output frequency to input voltage. This is well illustrated in FIG. 2 in which the abscissa represents the input voltage Vin, and the ordinate, the output frequency $f_{ref}$. In FIG. 2, a rectilinear curve I represents an ideal characteristic. Rectilinear curves II and III are depicted with increased and decreased $\alpha$. As seen from these curves, when $Vref = Vin$, the output frequency of the oscillator 22 is, by necessity, equal to the frequency $f_{ref}$. If not so, the output frequencies will not be invariable under influence by the process parameter variation.

Further, in the FIG. 1 circuit, the process gain variation results in a change in a gain as defined by the ratio of change in the oscillating frequency to a change in the input voltage, and hence, a change in the loop gain of the PLL. The loop gain variation leads to variation in important characteristics such as damping and pull-in characteristics as well as in the response characteristic.

SUMMARY OF THE INVENTION

Accordingly, an object of the present invention is to provide a voltage controlled oscillator of which the input voltage vs. output frequency is not varied even if process parameters are varied when it is manufactured.

According to the present invention, there is provided a voltage controlled oscillator for producing an output signal with a frequency corresponding to an input voltage applied thereto, the voltage controlled oscillator comprising:

an oscillating section (30) having at least one first capacitor (47, 49), and receiving first and second input voltages, the first capacitor (47, 49) being charged by a first current corresponding to the first input voltage, and the oscillator (30) oscillating in response to a charged voltage across the first capacitor (47, 49) and the second input voltage;

a second capacitor (36);

means (32, 33) connected to the second capacitor (36) for receipt of the first input voltage, and for charging the second capacitor (36) for a predetermined time with a second current corresponding to the first input voltage; and voltage control means (37, 31) connected to the second capacitor (36) for receipt of a predetermined reference voltage, for detecting a maximum value of the charged voltage across the second capacitor (36), for comparing the maximum voltage detected with the reference voltage, and for controlling the first input voltage so that the maximum voltage and said reference voltage will be equal to each other.

With such an arrangement, even if various process parameters, for example, capacitances of capacitors, gate lengths of transistors, threshold values of transistors are varied when the VCO circuits are integrated or fabricated, the output frequency of the circuit is free from the influence of the various process parameters. Therefore, a VCO circuit having an output frequency corresponding exactly to an input voltage can be fabricated.

BRIEF DESCRIPTION OF THE DRAWINGS

FIGS. 5A to 5D, and FIGS. 6A to 6C show signal waveforms useful in explaining the operation of the FIG. 3 circuit;

FIGS. 8A to 8F show signal waveforms useful in explaining the operation of the circuit of FIG. 7;

FIG. 9 is a circuit diagram of the timing control circuit;

DETAILED DESCRIPTION OF THE PREFERRED EMBODIMENT

A voltage controlled oscillator according to an embodiment of the present invention will be described referring to the accompanying drawings.

Figure 1:
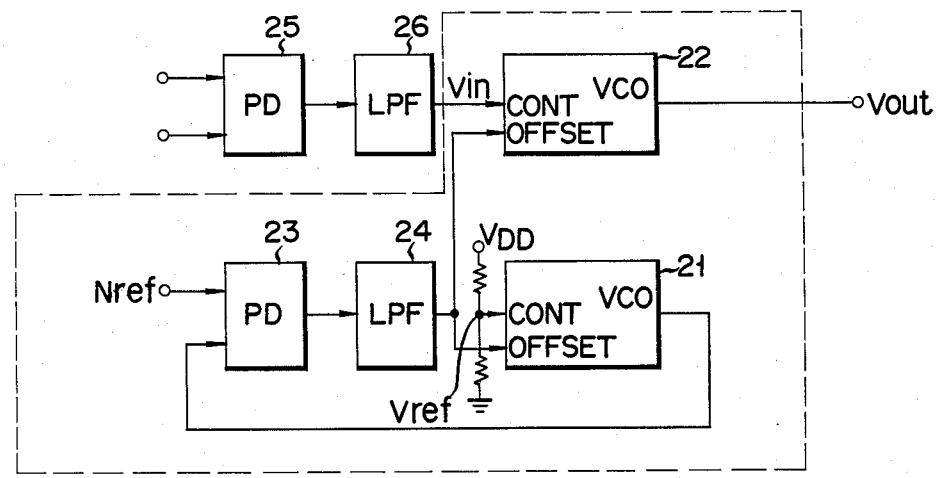
FIG. 1 is a block diagram of a prior voltage controlled oscillator.
Figure 2:
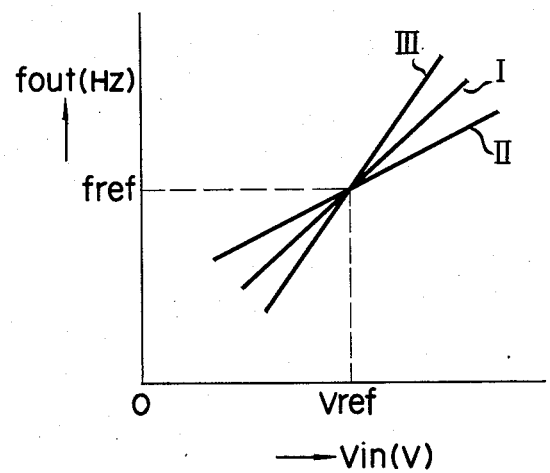
FIG. 2 shows a graph depicting the voltage vs. output frequency characteristic of the FIG. 1 circuit.
Figure 3:
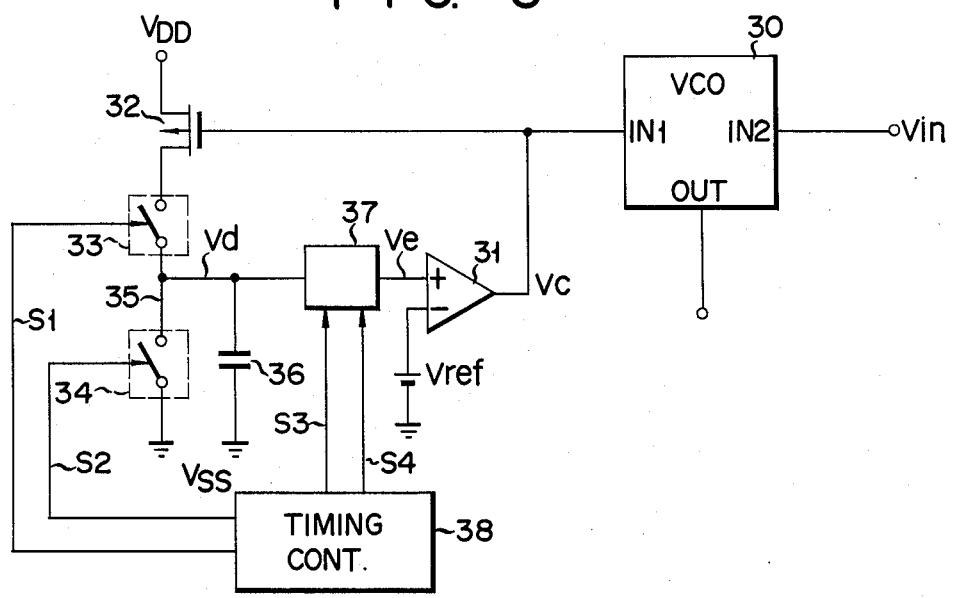
FIG. 3 is a block diagram of a voltage controlled oscillator according to the present invention.

The circuit arrangement of the voltage controlled oscillator will first be described referring to FIG. 3. In FIG. 3, an oscillating section 30 produces, at the output terminal OUT, a signal of a frequency as defined by voltages applied to first and second voltage input terminals IN1 and IN2.

The output voltage Vc of an operational amplifier 31 is supplied as a first input voltage to the first voltage input terminal IN1. An input voltage Vin is supplied as a second input voltage to the second voltage input terminal IN2. The output frequency of the oscillating section 30 is controlled by the input voltage Vin.

The output terminal of the operational amplifier 31 is also coupled with the gate of a P channel MOS transistor 32. The transistor 32 operates in a saturation region and serves as a constant current source for generating a current dependent on the output voltage Vc. The source of the transistor 32 l is coupled with a terminal or a point to which power voltage VDD is applied. This terminal will frequently be called a VDD supply. The drain of the transistor 32 is connected to one of the fixed contacts of a first switch 33. The other fixed contact of the switch 33 is connected to one of the fixed contacts of a second switch 34. The other fixed contact of the second switch 34 is coupled with a terminal or a point to which ground potential VSS is applied. This terminal will be frequently called a VSS supply.

A node 35 between the first and second switches 33 and 34 is coupled with one of the electrodes of a capacitor 36. The other electrode of the capacitor 36 is connected to the VSS supply. The one electrode of the capacitor 36 is additionally coupled with the input terminal of a sample/hold circuit 37. The output terminal of the sample/hold circuit 37 is connected to a positive input terminal of the operational amplifier 31. A reference voltage Vref is supplied to a negative input terminal of the operational amplifier 31. A timing control circuit 38 is provided for controlling timings of the operations of the switches 33 and 34 and the sample/hold circuit 37. The timing control circuit 38 is connected to movable contacts of the first and second switches 33 and 34, and further to the sample/hold circuit 37. The timing control circuit 38, thus coupled, supplies a first control signal S1 to the first switch 33, a second control signal S2 to the second switch 34, , and third and fourth control signals S3 and S4 to the sample/hold circuit 37.

A circuit arrangement of the oscillating section 30 illustrated in block form in the FIG. 3 circuit will be given in detail referring to FIG. 4. The output terminal of the operational amplifier 31 is connected to the gate of a P channel MOS transistor 41. The transistor 41 is operated in the saturation region. As such it operates as a constant current source for feeding a current dependent on the output voltage Vc of the operational amplifier 31. The source of the transistor 41 is connected to the VDD supply. The drain of the transistor 41 is coupled with the source of a P channel MOS transistor 42. The drain of the P channel MOS transistor 42 is connected to the drain of an N channel MOS transistor 43. The source of the transistor 43 is connected to the VSS supply. The gates of the transistors 42 and 43, which serve as switches, are interconnected.

Similarly, the drain of the transistor 41 is connected to the source of a P channel MOS transistor 44. The drain of the transistor 44 s connected to the drain of an N channel MOS transistor 45. The source of the transistor 45 is grounded. These transistors 44 and 45 are interconnected at their gates and act as switches.

The connection point of the drains of the transistors 42 and 43 is connected to one of the electrodes of a capacitor 47. The capacitor 47 is connected to the VSS supply. Similarly, the connection point between the drains of the transistors 44 and 45 is connected to one of the electrodes of a capacitor 49. The other electrode of the capacitor 49 is connected to the VSS supply. The one electrode of the capacitor 47, i.e., the node 46 is connected to the positive input terminal of a first comparator 50. The one electrode of the capacitor 49, i.e., the node 48 is connected to the positive input terminal of a second comparator 51. The input voltage Vin is applied to the negative input terminals of the comparators 50 and 51.

The output signal of the first comparator 50 is connected to the set input terminal of a flip-flop (FF) 54. The output terminal of the second comparator 51 is coupled with the reset input terminal of the FF 54. The FF 54 is of the known type in which two NOR gates 52 and 53 are cross-coupled with each other.

The Q output terminal of the FF 54 is connected to the gates of the transistors 42 and 43. The $\overline{Q}$ output of the FF 54 is connected to the gates of the transistors 44 and 45. The $\overline{Q}$ output signal of the FF 54 is used as an output signal of the oscillating section 30.

The operation of the voltage controlled oscillator illustrated in FIGS. 3 and 4 will be described referring to the timing charts of FIGS. 5A to 5D and FIGS. 6A to 6C.

It is assumed that the FF 54 is set. On this assumption, the Q output signal of the FF 54 is logical "1" or high in level, while the $\bar{Q}$ output is logical "0" or low in level. Under this condition, the transistors 42 and 45 are turned off and the transistors 43 and 44 are turned on. This being the case, the current fed from the transistor 41 flows to ground through the transistor 44 and the capacitor 49. This current, of which the flow is indicated by a continuous line with an arrow head denoted as I1, charges the capacitor 49. With the charge, the potential VB of the one electrode of the capacitor 49 increases linearly with time, as shown in FIG. 5B. At this time, the transistor 43, as turned on, provides a discharge path for the capacitor 47, so that the capacitor 47 discharges, decreasing the potential VA, at its one electrode, to ground potential.

As the increasing potential VB reaches the input voltage Vin, the second comparator 51 produces a signal of logical "1". The logical "1" signal goes to the reset terminal of the FF 54. Then, the FF 54 is reset with the Q output being logical "0" and the $\bar{Q}$ output being logical "1", as shown in FIGS. 5C and 5D.

Responsive to the level changes of the Q signal and the $\bar{Q}$ signal, the transistors 42 and 45 are turned on, while the transistors 43 and 44 are turned off. As a result, the capacitor 49 is discharged through the transistor 45 and the potential VB is decreased to ground potential. Further, the output signal of the second comparator 51 becomes logical "1".

Turning on of the transistor 42 allows a current flow from the VDD supply to ground through the transistors 42 and the capacitor 47. The current I2 charges the capacitor 47. With progression of the charging, the potential VA at one side of the capacitor 47 increases linearly, as shown in FIG. 5A. As the increasing potential VA reaches the input voltage Vin, the output signal of the first comparator 50 becomes logical "1". The result is that the FF 54 is again set, with the Q output signal being logical "1" and the $\bar{Q}$ output signal being logical "0".

In response to the level changes of the Q and $\bar{Q}$ signals, the transistors 42 and 45 are turned off, while the transistors 43 and 44 are turned on. Then, the capacitor 47 is discharged while the capacitor 49 is charged by the current I1, with the potential VB being gradually increased.

Subsequently, an operation similar to the above is repeated. In this way, the Q and $\bar{Q}$ output signals each oscillate at a predetermined frequency. In this instant, the $\bar{Q}$ output signal is used as the output signal of the oscillating section 30, as described above.

The oscillating frequency of the output signal can be varied by changing the output voltage Vc of either the operational amplifier 31 or the input voltage Vin. The frequency f can be expressed by $$f = \frac{1}{\frac{C47 \cdot Vin}{I41} + \frac{C49 \cdot Vin}{I41} + TD0 + TD1} \quad (2)$$

$$= \frac{I41}{Vin \cdot (C47 + C49) + I41 \cdot (TD0 + TD1)}$$

where C47 and C49 are capacitances of the capacitors 47 and 49. I41 is the current flowing through the transistor 41. TD0 is a signal delay time of the first comparator 50. TD1 is a signal delay time of the second comparator 51.

If $C47 = C49 = C$, and $TD0 = TD1 = TD$, the equation (2) can be simplified as $$f = I41\{2 \cdot (C \cdot Vin + I41 \cdot TD)\} \quad (3)$$

The operation of the overall VCO shown in FIG. 3 will be described. The timing charts shown in FIGS. 6A to 6C illustrate the operation of the VCO except the oscillating section 30. The timing control circuit 38 produces the first and second control signals S1 and S2 at the timings shown in FIGS. 6A and 6B. As shown, in the signal S1, a logical "0" state continues for a period T0. In the signal S2, the logical "0" state still continues for a predetermined period of time after the signal S1 is pulsed to the high level or logical "1".

The first switch 33 keeps an ON state during the period T0 that the signal S1 is logical "0". For the logical "0" period, current flows through a path of the transistor 32, the switch 33, and the capacitor 36. This current charges the capacitor 36. As recalled, the value of the current depends on the output voltage Vc of the operational amplifier 31. As the charge progresses, the potential Vd of the one electrode of the capacitor 36 increases at a fixed rate of change. Then, when the signal S1 is logical "1", the first switch 33 is turned off, and the charging of the capacitor 36 stops. The capacitor 36 keeps the voltage Vd at the maximum value. Then, the second control signal S2 is pulsed from logical "0" to logical "1", and the second switch 34 is turned on. The capacitor 36 is discharged and the voltage Vd drops to logical "0". During the period that the signal S1 is logical "1" and the signal S2 is logical "0", the sample/hold circuit 37 operates to sample the maximum value of the voltage Vd and to produce it as the output voltage Ve. The held voltage, or the output voltage Ve of the sample/hold circuit 37 is applied to the operational amplifier 31. The operational amplifier 31 compares the voltage Ve with the reference voltage Vref. The voltage Vc representing the result of the comparison is applied to the gate of the transistor 32.

Such a sequence of operations is repeated, until, finally, the voltage Vc is controlled to have a value such that the voltages Ve and Vref are coincident with each other.

It is assumed now that the capacitance of the capacitor 36 is C36, and the current flowing through the transistor 32 is I32. Since the capacitor 36 of capacitance C36 is charged by the current I32 for the period T0, the final value Vem of the voltage Ve is $$Vem = (T0 \cdot I32)/C36 \quad (4)$$

When the voltage Vem is controlled such that it is equal to the reference voltage Vref, i.e., Vem = Vref, the following equation holds $$Vref = (T0 \cdot I32)/C36 \quad (5)$$

The gate of the transistor 32 is connected to the gate of the transistor 41 of the oscillating section 30. Therefore, the current I32 flowing through the transistor 32 is proportional to the current flowing through the transistor 41. It is assumed that G is a ratio of the currents I32 to I41, which depends on a ratio of geometrics between these transistors. With this relation, the equation (3) can be rewritten as $$f = \frac{I32/G}{2 \cdot (C \cdot Vin + I32 \cdot TD/G)} \quad (6)$$

Rearranging the equation (5) with respect to I32, we have $$I32 = C36 \cdot Vref/T0 \quad (6')$$

Substituting the above equation (6') into the equation (6), we then have $$f = \frac{C36 \cdot Vref/(G \cdot T0)}{2 \cdot \{C \cdot Vin + (TD \cdot C36 \cdot Vref)/(G \cdot T0)\}} \quad (7)$$

Assuming that G=1, that is, the transistors 32 and 41 are equal in channel width and channel length, the capacitance of the capacitor C36 is C like the capacitors 47 and 49, and, further, the delay time TD is zero, the equation (7) can be simplified into $$f = Vref/(2 \cdot Vin \cdot T0) \quad (8)$$

In the equation (8), the factor T0 can be set up exactly if a crystal oscillator for clock pulse oscillation is used for the timing control circuit 38, and an exact value of the reference voltage Vref can easily be realized. Hence, the equation (8) shows that the frequency of the output signal from the VCO under discussion depends solely on the input voltage Vin, that is, it is independent of the influences of the process parameters of MOS transistors. When $Vin = Vref$, the oscillating frequency f is equal to 1/(2·T0).

In connection with the IC fabrication of the VOC, the capacitances of the capacitors and the widths and lengths of the transistors in one chip are generally different from those in another chip. Within one chip, the absolute values of the capacitance and the gate length, may be changed, but the ratio of capacitances and gate lengths between or among the capacitors can be easily established as a constant. Accordingly, if one manufactured capacitor 47, for example, has a different capacitance from its designed value, those of the remaining ones 36 and 49 can change accordingly but in relation to their designed values. So the capacitance of the capacitors 36, 47, 49, and the channel width and channel length of the transistors 32 and 41 can equal each other. This fact can satisfy the condition for making the equation (8). Thus, according to the present invention, the variation problem of the oscillating frequencies among the semiconductor chips, which arises from the process parameter difference, can be eliminated.

In the embodiment described above, the capacitors 36, 47 and 49 have the same capacitance C, and the current ratio G is 1. Nonetheless, the present invention is not limited to this embodiment. The capacitors may have different capacitances, and the gate length and other structural features of each transistor may be changed.

Circuitry including the switches 33 and 34, the sample/hold circuit 37 and the reference voltage Vref, will be described referring to FIG. 7.

The first switch 33 is constructed with a P channel MOS transistor. One end of the current path of this MOS transistor is connected to the P channel MOS transistor 32, and the other end to the second switch 34. The gate of the MOS transistor of the first switch 33 is connected for reception to the first control signal S1. The second switch 34 is constructed with an N channel MOS transistor. One end of this MOS transistor is connected to the first first switch 33, while the other end is connected to the VSS supply. The gate of the MOS transistor receives the second control signal S2.

The sample/hold circuit 37 is comprised of first and second CMOS analog switches 61 and 62, and capacitors 63 and 64. The first analog switch 61 is made up of P channel and N channel MOS transistors of which the current paths are connected in parallel. The node of the interconnection between one set of ends of the current paths of the paired transistors is connected to one of the electrodes of the capacitor 36. The third control signal S3 is supplied to the gate of the N channel MOS transistor in the analog switch 61. The control signal S3 is inverted by an inverter and supplied to the gate of the P channel MOS transistor of the same switch 61. The output terminal of the first analog switch 61 is connected to one of the electrodes of a capacitor 63. The capacitor 63 is earthed at the other electrode. The analog switch 62 has substantially the same circuit arrangement as that of the first analog switch 61, and is under the control of the fourth control signal S4. The input terminal of the analog switch 62 is coupled with the output terminal of the first analog switch 61 and the capacitor 63. A capacitor 64 is inserted between the output terminal of the second analog switch and ground. The node between the output terminal of the second analog switch 62 and the capacitor 64 serves as an output terminal of the sample/hold circuit 37. The capacitor 64 may be a stray capacitance present in association with the output terminal of the second switch 62 and the input terminal of the operational amplifier 31.

The reference voltage Vref applied to the negative input terminal of the operational amplifier 31 is derived from a node between resistors 65 and 66, which are connected in series between the VDD supply and ground. Thus, the VDD voltage is divided according to the resistance ratio of these resistors. The divided voltage is used as the reference voltage Vref.

Figure 7:
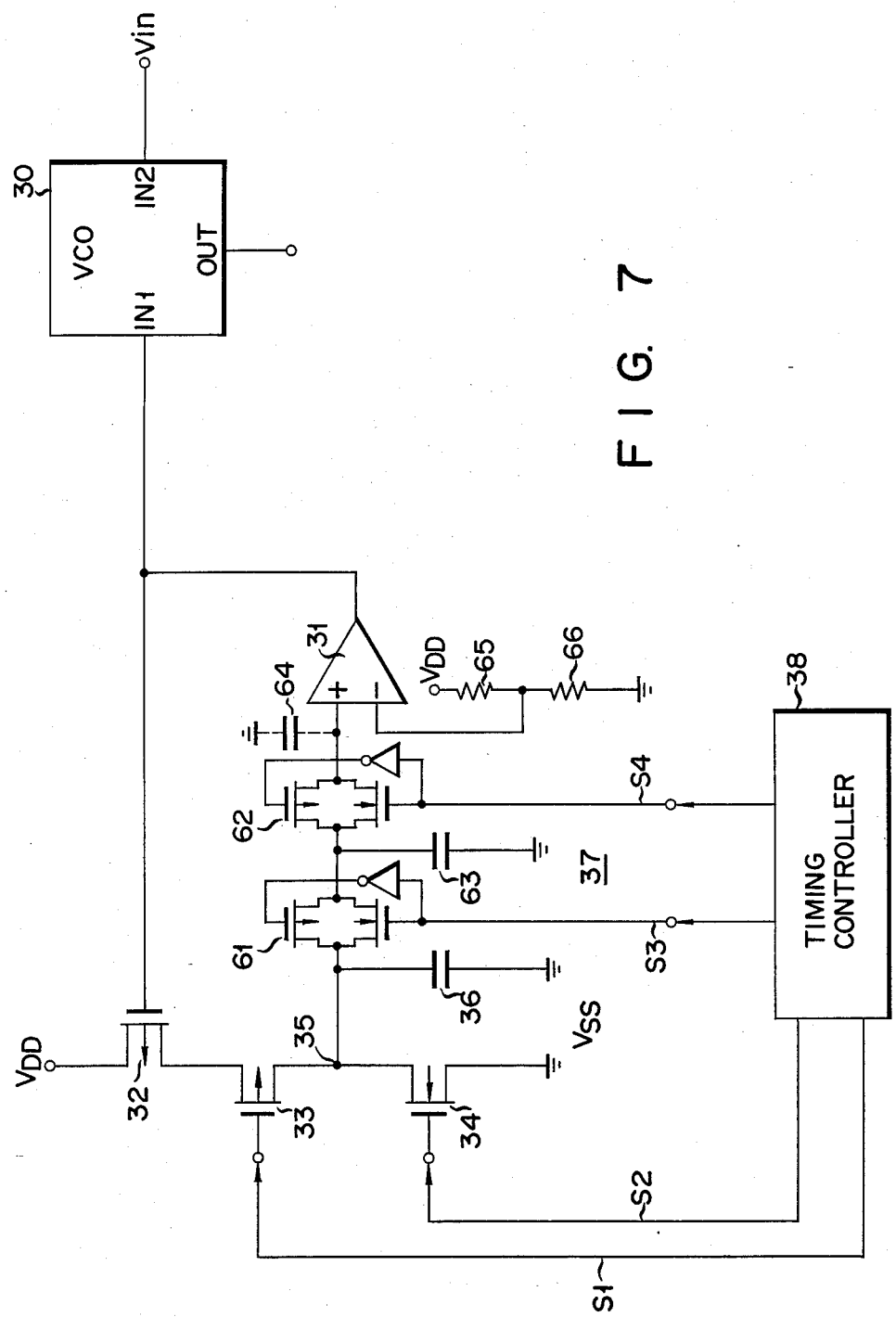
FIG. 7 is a circuit diagram illustrating in detail a portion of the FIG. 3 circuit; excluding the timing control circuit and the oscillating section.

The operation of the voltage controlled oscillator as illustrated in FIG. 7 will be described referring to FIGS. 8A to 8F. The control signals S1 to S4 are formed using the clock pulses CLK shown in FIG. 8A. In this embodiment, the trailing edge of the signal S1 (FIG. 8B) is delayed by a given period td behind the trailing edge of the signal S2. This indicates that the charge time of the capacitor 36 is (T0−td).

When the signal S1 is logical "0", the first switch 33 is turned on. At this time, the signal S2 is logical "0" and the second switch 34 is in an off state. Under this condition, the capacitor 36 is charged. The charged voltage of the capacitor 36 rises linearly. When the signal S1 is logical "1", the first switch 33 is turned off to terminate the charging of the capacitor 36. Then, the signal S3 becomes logical "1", so that the charged potential across the capacitor 36 is kept by the capacitor 63. Subsequently, the signal S4 becomes logical "1", and the voltage across the capacitor 63 is kept by the capacitor 64. After the signal S3 becomes "1" in logical level, the signal S2 is pulsed to logical "1" to allow the discharge of the capacitor 36. The signal S4 maintains logical "1" level during the period that the capacitor 36 is charged by the transistor 32, and discharged by the switch 34. The charged voltage across the capacitor 64 is applied, as the output voltage of the sample/hold circuit 37, to the positive input terminal of the operational amplifier 31.

The purpose of providing the delay time td in the signal S1 is to compensate for the delay time TD in each of the comparators 50 and 51. If the delay time td is equal to the delay time TD, the charge time of the capacitor 36 is T0−TD. Therefore, in the equation (7), for example, the delay times TD and td are cancelled, remarkably reducing the effect by the delay time TD. Thus, even if the comparators 50 and 51 contain delay times, the VCO can produce an oscillating signal of an exact frequency.

A detailed circuit arrangement of the timing control circuit 38 will be described referring to FIG. 9. In FIG. 9, the clock pulses CLK are inverted and applied to the clock signal input of the latch 71. The Q output terminal of the latch 71 is coupled with the D input terminal of the latch 72. The $\overline{Q}$ output terminal of the latch 72 is coupled with the D input terminal of the latch 71. The clock input terminal of the latch 72 is coupled for reception with the clock pulses CLK. The Q bar output terminal of the FF 73 is connected to its D input terminal, and the Q output terminal thereof is coupled with the clock signal input terminal of an FF 74. The $\overline{Q}$ output terminal of the FF 74 is coupled with the D input terminal of the FF 74. With this connection, the output signal of the latch 72 is frequency-divided into a factor of two by the FF 73 at the succeeding stage. Then, the output signal of the FF 73 is further frequency divided into a factor of two by the succeeding stage FF 74. The Q output terminal of the FF 74 is input to a delay circuit 80.

The NOR gate 75 receives the Q output signals from the FFs 73 and 74, and produces the second control signal S2. The NAND gate 76 receives the Q output signal of the FF 73, as well as the $\overline{Q}$ output signal of the FF 74, and produces the fourth control signal S4. The NOR gate 77 is coupled for reception with the Q output signal of the latch 71, and produces the third signal S3.

An arrangement of the delay circuit 80 will be given. The Q output signal of the FF 74 is input to the input terminal of a CMOS inverter 81 including a pair of P and N channel MOS transistors. One end of the current path of the P channel of the inverter 81 is connected to one end of the current path of a P channel MOS transistor 82. The other end of the current path of this transistor 82 is coupled with the VDD supply. The gate of the transistor 82 is coupled with the gate and one end of the current path of a P channel MOS transistor 83. The transistor 83 is connected at the other end of the current path to the VDD supply. The transistors 82 and 83 cooperate to form a current mirror circuit 84 which feeds a predetermined current to the P channel transistor of the inverter 81.

The current path of an N channel MOS transistor 85 is inserted between the inverter 81 and a ground. The transistor 85 is biased to a fixed bias point by a bias source Vc. The transistor 85 feeds a fixed current to the N channel transistor of the inverter 81. The current path of an N channel MOS transistor 86 is inserted between the current mirror 84 and a ground. The same bias source Vc is applied to the gate of the transistor 86. The transistor 86 feeds a predetermined current to the current mirror 84. The output signal of the CMOS inverter 81 is input to an inverter 87. Both the output signal of the inverter 87 and the Q output signal of the FF 74 are applied to a NAND gate 88. The NAND gate 88 produces the first control signal S1.

A second embodiment of a voltage controlled oscillator according to the present invention will be described referring to FIG. 10. This embodiment is different from the first embodiment of FIG. 3 in the following points. The output terminal of the sample/hold circuit 37 is connected to the negative input terminal of the operational amplifier 31. The positive input terminal of the operational amplifier 31 is coupled with the reference voltage Vref. A capacitor is connected between the negative input terminal and the output terminal of the operational amplifier 31. The amplifier 31 and the capacitor comprise an integration circuit. The output terminal is connected to the gate of an N channel MOS transistor 91. Another P channel MOS transistor 92 whose gate and one current path are connected to one end of the transistor 91 and the gates of the transistors 32 and 41. The other end of the current path of the transistor 92 is coupled with the VDD supply. The other end of the current path of the transistor 91 is grounded. The transistor 92 serves as a current load for the transistor 91. The transistors 32, 92 and 41 form a current mirror.

In operation, the output voltage Vc of the operational amplifier 31 determines the current flowing through the transistors 91. This current causes a voltage drop across transistor 92. The transistor 92 and transistors 32 and 41 comprise current mirror circuits. The currents corresponding to the voltage Vc flow through the transistors 32 and 41.

Figure 11:
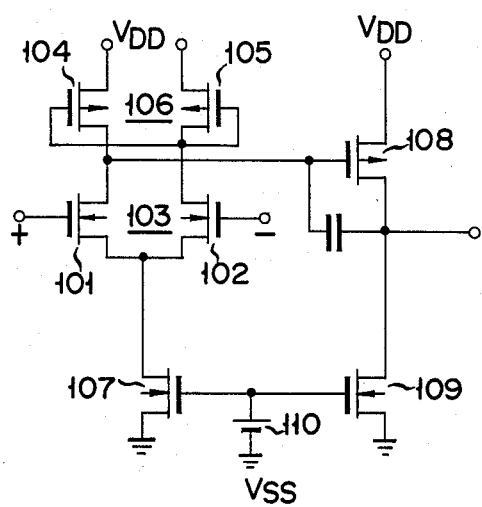
FIGS. 11 and 12 are circuit diagrams of a comparator used in the above circuits.

A detailed circuit arrangement which is available for the operational amplifier 31 and the comparators 50 and 51 in the oscillating section 30 (FIG. 4) will be described referring to FIG. 11. In FIG. 11, one end of the current path of an N channel MOS transistor 101 is connected to one end of that of an N channel MOS transistor 102. These transistors 102 and 103 constitute a differential amplifier 103. The other end of the transistor 101 is connected to one end of that of a P channel 104. The other end of the current path of this transistor is coupled with the VDD supply. The other end of the current path of the transistor 102 is connected to one end of the current path of a P channel MOS transistor 105. Its other end is coupled with the VDD supply. The gates of these transistors 104 and 105 are connected to the connection point between the current paths of the transistors 102 and 105. The transistors 104 and 105 form a current mirror circuit 106, which serves as a load for the differential pair 103.

The connection point between the current paths of the transistors 101 and 102 is connected to one end of the current path of an N channel MOS transistor 107. The other end of the current path of this transistor is grounded. The transistor 107 serves as a current source to feed the operating current to the differential pair 103. A node between the transistors 101 and 104 is coupled with the gate of a P channel MOS transistor 108. The output signal of the differential pair 103 is supplied to the gate of the transistor 108. One end of the current path of the transistor 108 is connected to the VDD supply. Its other end is connected to one end of the current path of a N channel MOS transistor 109 is a current load for the transistor 108. The gate of the transistor 109 is connected to the gate of the transistor 107, and its other end is grounded. The gates of the transistors 107 and 109 are biased by a bias source 110.

In this circuit arrangement, the gate of the transistor 101 is used as the positive input terminal, while the gate of the transistor 102 is used as the negative input terminal. The output signal is derived from a node between the transistors 108 and 109.

Figure 12:
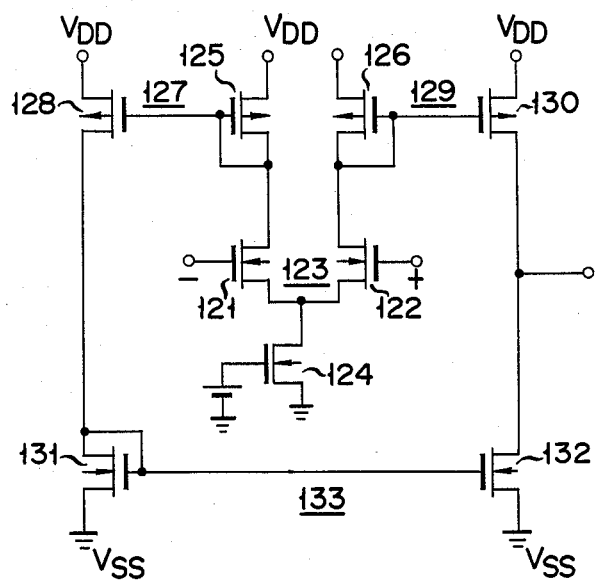

Another example of the operational amplifier will be given referring to FIG. 12. In the figure, one end of the current path of an N channel MOS transistor 121 is connected to one end of that of an N channel MOS transistor 122. These transistors form a differential pair 123. A node between the transistors 121 and 122 is connected to one end of the current path of an N channel MOS transistor 124. The other end of the current path of this transistor 124 is grounded, and its gate is applied with a fixed voltage for biasing purposes.

The other end of the current path of the transistor 121 is connected to the gate and one end of the current path of a P channel MOS transistor 125. The other end of the current path of the transistor 125 is coupled with the VDD supply. The other end of the current path of the transistor 122 is connected to the gate and one end of the current path of a P channel MOS transistor 126. The other end of the current path of this transistor 126 is coupled with the VDD supply. The transistors 128 and 125 are interconnected at the gates. The transistor 125 and 128 form a current mirror 127.

The gate of a P channel MOS transistor 130 is connected to the gate of the transistor 126. The transistors 126 and 130 form a current mirror 129. The ends of the current paths of these transistors 128 and 130 are applied with the VDD supply. The other end of the current path of the transistor 128 is connected to the gate and one end of the current path of an N channel MOS transistor 131. The other end of the current path of this transistor 131 is grounded. The other end of the current path of the transistor 130 is connected to one end of the current path of an N channel MOS transistor 132. The other end of the current path of the transistor 132 is grounded. The gate of transistor 132 is connected to the gate of the transistor 131. The transistors 131 and 132 form a current mirror circuit 133.

The gate of the transistor 121 serves as an inverting input terminal, while that of the transistor 122 serves as a noninverting input terminal. The output signal is derived from a node between the transistors 130 and 132.

Figure 4:
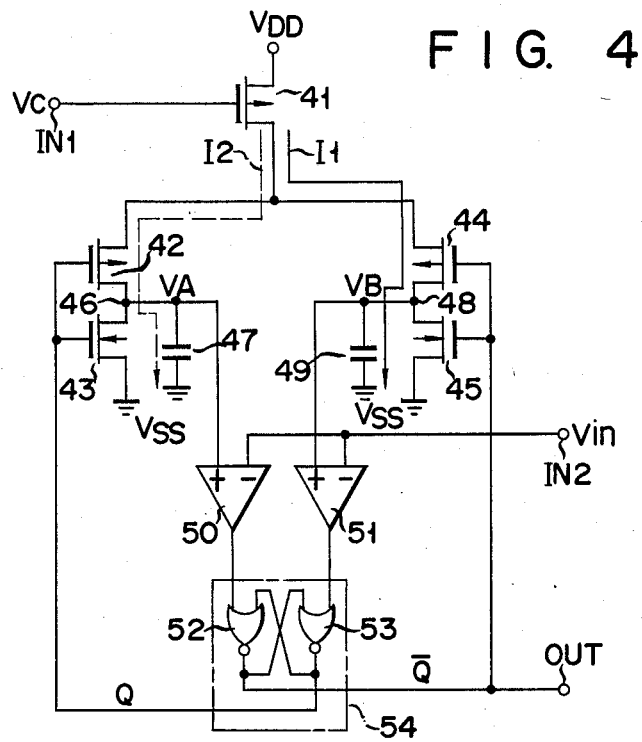
FIG. 4 is a circuit diagram of the oscillating section used in the FIG. 3 circuit.
Figure 13:
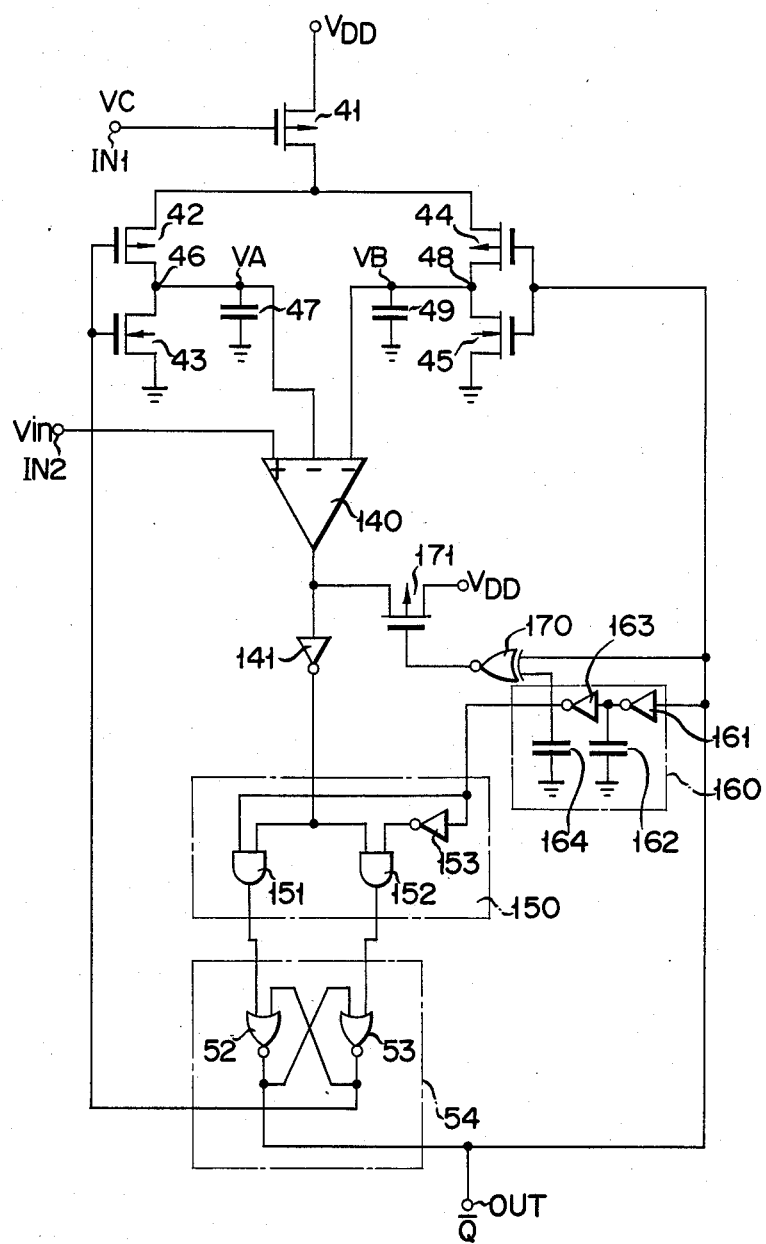
FIG. 13 is a circuit diagram of another oscillating section used in the voltage controlled oscillator of the present invention.

The oscillating section 30 may employ many circuit arrangements other than that of FIG. 4. One of such candidates is illustrated in FIG. 13. In the figure, like reference numerals are used for indicating like or equivalent portions in FIG. 4.

The two positive input terminals of a three-input comparator 140 are coupled for reception with the potential VA of the capacitor 47 and the potential VB of the capacitor 49. The input voltage Vin is applied to the negative input terminal of the comparator 140. The comparator 140 operates so as to compare the voltage Vin at the negative input terminal with either of the potentials at the positive input terminals for the purpose of determining which is higher than the other. The output signal of the comparator 140 is supplied through an inverter 141 to a select circuit 150.

The select circuit 150 is comprised of two AND gates 151 and 152, and an inverter 153. The input terminals of the AND gates 151 and 152 receive the output signal of the inverter 141. The other input terminal of the AND gate 151 is coupled for reception with the $\overline{Q}$ signal of the FF 54 through a delay circuit 60 to be given later. The delayed $\overline{Q}$ signal of the FF 54 is applied through an inverter 153 to the other input terminal of the AND gate 152. The output terminal of the AND gate 151 is connected to the set input terminal of the FF 54. The output terminal of the AND gate 152 is connected to the reset input terminal of the FF 54.

With such a connection, when the delay signal is logical "1", the output signal of the inverter 141 is applied to the set input terminal of the FF 54. When the delayed signal is logical "0", the output signal of the inverter 141 is supplied to the reset input terminal of the FF 54.

The $\overline{Q}$ output signal of the FF 54 is input to the delay circuit 160. The delay circuit 160 is comprised of an inverter 161 coupled for reception with the $\overline{Q}$ output signal of the FF 54, a capacitor 162 inserted between the output terminal of the inverter 161 and ground, another inverter 163 coupled for reception with the output signal of the inverter 161, and another capacitor 164 coupled between the output terminal of the inverter and ground. The output signal of the inverter 163 is applied, as a delayed signal, to the select circuit 150. The delayed signal and the $\overline{Q}$ signal are coupled for transmission with an exclusive OR gate 170. The output signal of the exclusive OR gate 170 is supplied to the gate of a P channel MOS transistor 171. The current path of this transistor 171 is placed between the output terminal of the comparator 140 and the VDD supply.

The operation of this embodiment is substantially the same as that of the FIG. 4 embodiment. The reason behind the provision of the delay circuit 160 will be given. A signal delay is inevitably involved in the comparator 140. Immediately after the logical state at the output of the FF 54 changes, it is returned to its original state due, as is highly possible, to the signal delay. In an extreme case, the FF 54 oscillates irrespective of the potentials VA and VB. This is an incorrect operation.

To cope with this, the present embodiment forcibly places the output signal of the comparator 140 into logical "1" for the signal delay time and by the delay circuit 160. Then, the select circuit 150 is switched to another state. In this way, the undesired inversion of the FF 54 is prevented.

Figure 10:
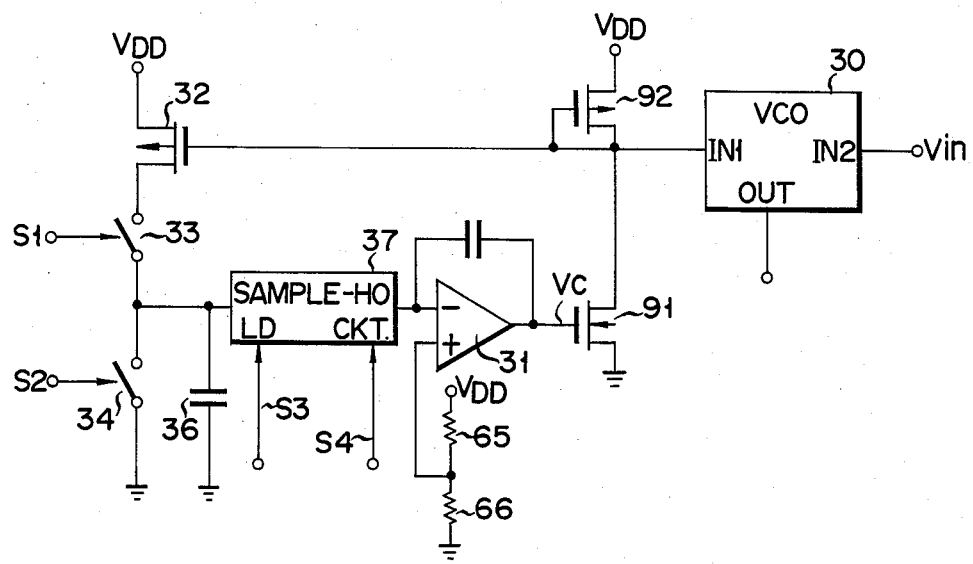
FIG. 10 is a circuit diagram of a voltage controlled oscillator according to a second embodiment of the present invention.

The experiment was conducted for checking the operation of the voltage controlled oscillator as shown in FIG. 10. The results of the experiment were plotted in FIG. 14, where the abscissa represents the input voltage Vin and the ordinate represens the frequency fout of the output signal. In the experiment, the capacitance of each of the capacitors 36, 47 and 49 was 1010 pF; the reference voltage Vref 2.5 V, the VDD 5 V; and the period T0 for logical "0" of the first control signal S1, 25 uS.

Figure 14:
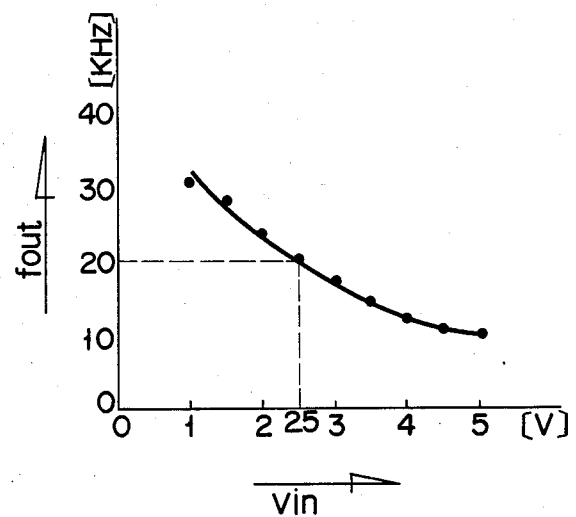
FIG. 14 shows a graph illustrating the results of an experiment with the voltage controlled oscillator of the present invention.

As seen from FIG. 14, when $Vin = Vref$, $f_{out}$ is 20 KHz. This value satisfies the equation (8). It was confirmed that similar results were obtained even for different parameters. It should be understood that the present invention is not limited to the above-mentioned embodiments. For example, other suitable circuit arrangements are available for circuits 30, 31, 50, 51, 140, 33, 34, 37, and 38. Further, the polarity of each transistor may be inverted in each embodiment.

What is claimed is:

1. A voltage controlled oscillator for producing an output signal with a frequency corresponding to an input voltage applied thereto, said voltage controlled oscillator comprising:
   an oscillating section having at least one first capacitor, and receiving first and second input voltages, said first capacitor being charged by a first current corresponding to said first input voltage, and said oscillator oscillating in response to a charged voltage across said first capacitor and said second input voltage;

a second capacitor;

means connected to said second capacitor for receipt of said first input voltage, and for charging said second capacitor for a predetermined time with a second current corresponding to said first input voltage; and voltage control means connected to said second capacitor for receipt of a predetermined reference voltage, for detecting a maximum value of the charged voltage across said second capacitor, for comparing said detected maximum voltage with said reference voltage, and for controlling said first input voltage so that said maximum voltage and said reference voltage will be equal to each other.

2. The oscillator according to claim 1, in which said voltage control means includes peak voltage holding means for detecting a peak voltage across said second capacitor, and for producing the peak voltage, voltage comparing means for comparing said peak voltage across said second capacitor, as output from said peak voltage holding means, with said reference voltage, and for controlling said first voltage so that both said peak voltage and said reference voltage will be equal to each other.

3. The oscillator according to claim 2, in which said peak voltage holding means is a sample/hold circuit for sampling and holding the charged voltage across said second capacitor following the end of the charging of said second capacitor.

4. The oscillator according to claim 2, in which said comparing means is an operational amplifier, receiving, at the positive input terminal, the peak voltage output from said holding means, and, at the negative input terminal, said reference voltage; and producing said first voltage.

5. The oscillator according to claim 1, further comprising means for discharging said second capacitor after a fixed period following the end of the charging of said second capacitor.

6. The oscillator according to claim 1, in which said charging means for receiving at a gate said first voltage, and for charging said second capacitor, includes a MOS transistor for generating said second current in its current path in response to said first voltage; and switching means connected to the current path of said MOS transistor and said second capacitor for maintaining an on state for said predetermined period.

7. The oscillator according to claim 1, in which said oscillating section includes:

means for generating said first current;

said at least one first capacitor;

means for charging said first capacitor by said first current; and means for comparing the charged voltage across said first capacitor with said second input voltage; for inverting the output signal level when the charged voltage across said first capacitor and said second input voltage are equal; and for discharging said first capacitor.

8. The oscillator according to claim 1, in which said oscillating section has a first MOS transistor, the gate of which is connected to receive the first voltage, and the current path of which allows for the passage of a first current corresponding to the first voltage; and said means for charging said second capacitor has a second MOS transistor, the gate of which is connected to receive the first voltage, and the current path of which generates a second current corresponding to the first voltage.

9. The oscillator according to claim 8, further comprising:

a third MOS transistor, the gate of which is coupled for reception with said first voltage, and the current path of which receives at one end a predetermined potential; and a fourth MOS transistor connected at the gate and one end of the current path to the other end of the current path of said third MOS transistor, the gate of said first MOS transistor, and the gate of said second MOS transistor; the other end of the current path of said fourth MOS transistor being coupled for reception with a predetermined power source voltage.

10. The oscillator according to claim 1, in which said means for charging a second capacitor includes a MOS transistor of which the gate receives said first voltage and one end of the current path is connected for reception with a power source voltage, and a switch element connected to the other end of the current path of said MOS transistor and said second capacitor, said switch element maintaining an on state for said predetermined period;

said voltage control means includes a sample/hold circuit for sampling and holding the charge voltage across said second capacitor following the end of the charging of said second capacitor, and an operational amplifier for receiving, at the positive input terminal, the output voltage of said sample/hold circuit, and, at the negative input terminal, said reference voltage; and for producing said first voltage; and said oscillating section includes a MOS transistor for receiving said first voltage and for providing said first current at the current path, said first capacitor, means for charging said first capacitor by said first current, and means for comparing the charged voltage across said first capacitor with said second input voltage for the purpose of inverting the output signal level when both said voltages are equal, and for discharging said first capacitor.

* * * * *